US012718556B2

(12) United States Patent
Gupta et al.

(10) Patent No.: US 12,718,556 B2
(45) Date of Patent: Aug. 25, 2026

(54) ELECTRIC GRID CONNECTION MAPPING

(71) Applicant: X Development LLC, Mountain View, CA (US)

(72) Inventors: Ananya Gupta, San Francisco, CA (US); Peter Evans, Los Altos Hills, CA (US); Leo Francis Casey, San Francisco, CA (US); Phillip Ellsworth Stahlfeld, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 1143 days.

(21) Appl. No.: 17/740,873

(22) Filed: May 10, 2022

(65) Prior Publication Data

US 2022/0375219 A1 Nov. 24, 2022

Related U.S. Application Data

(60) Provisional application No. 63/190,344, filed on May 19, 2021.

(51) Int. Cl.
*G06V 20/10* (2022.01)
*G06F 30/18* (2020.01)
(Continued)

(52) U.S. Cl.
CPC ............ *G06V 20/182* (2022.01); *G06F 30/18* (2020.01); *G06Q 50/06* (2013.01); *G06V 10/82* (2022.01); *G06V 20/13* (2022.01); *G06V 20/176* (2022.01)

(58) Field of Classification Search
CPC ......... G06F 30/18; G06V 10/82; G06Q 50/06
See application file for complete search history.

(56) References Cited

U.S. PATENT DOCUMENTS 8,340,360 B2 12/2012 Chen et al.
8,577,707 B2 11/2013 Nielsen et al.
(Continued)

FOREIGN PATENT DOCUMENTS

WO WO 2017/100916 6/2017
WO WO 2019/053588 3/2019

OTHER PUBLICATIONS

Gomes et al, "Mapping Utility Poles in Aerial Orthoimages Using TSS Deep Learning Method", pp. 1-14, Sensors, 2020 (Year: 2020).*

(Continued)

*Primary Examiner* — Edward Park
(74) *Attorney, Agent, or Firm* — Fish & Richardson P.C.

(57) ABSTRACT

Methods, systems, and apparatus, including computer programs encoded on a storage device, for predicting connections in electric grid models are disclosed. A method includes obtaining geospatial data representing a geographic area that includes an electrical distribution system; and generating, from the geospatial data, asset data that represents characteristics of electrical distribution system assets. The asset data includes: load data representing electrical loads of the electrical distribution system; and node data representing nodes of the electrical distribution system. The method includes processing the asset data using a connection model that is configured to predict electrical connections between assets of the electrical distribution system; and obtaining, from the connection model; output data indicating predicted electrical connections between assets of the electrical distribution system. The geospatial data includes at least one of overhead imagery or street level imagery of the geographic area.

18 Claims, 4 Drawing Sheets

(51) Int. Cl.

| | |
|---|---|
| ***G06Q 50/06*** | (2012.01) |
| ***G06V 10/82*** | (2022.01) |
| ***G06V 20/13*** | (2022.01) |

(56) References Cited

U.S. PATENT DOCUMENTS

| | | | | |
|---|---|---|---|---|
| 8,712,711 | B2 | 4/2014 | Nayar et al. | |
| 9,262,852 | B1 | 2/2016 | Kehl et al. | |
| 9,438,312 | B2 | 9/2016 | Bernheim et al. | |
| 9,541,641 | B2 | 1/2017 | Stolarczyk et al. | |
| 10,097,240 | B2 | 10/2018 | Hansell et al. | |
| 10,444,806 | B2 | 10/2019 | Brockman et al. | |
| 11,183,879 | B1 * | 11/2021 | Barnett | H02J 3/38 |
| 2012/0089384 | A1 | 4/2012 | Coyne et al. | |
| 2013/0166270 | A1 | 6/2013 | Sun et al. | |
| 2016/0343093 | A1 | 11/2016 | Riland et al. | |
| 2017/0092055 | A1 | 3/2017 | Brockman et al. | |
| 2018/0330242 | A1 | 11/2018 | Dubois et al. | |
| 2020/0025877 | A1 | 1/2020 | Sarkis et al. | |
| 2020/0034638 | A1 | 1/2020 | Brewington et al. | |
| 2020/0043285 | A1 | 2/2020 | Brockman et al. | |
| 2021/0141969 | A1 | 5/2021 | Stahlfeld et al. | |
| 2022/0375219 | A1 * | 11/2022 | Gupta | G06F 30/18 |

OTHER PUBLICATIONS

Zhang et al, "Using Deep Learning to Identify Utility Poles with Crossarms and Estimate Their Locations from Google Street View Images", Sensors, pp. 1-21, 2018 (Year: 2018).*

Jayadev et al, "Identifying Topology of Power Distribution Networks Based on Smart Meter Data", IEEE, 2016, pp. 1-8 (Year: 2016).*

Nespoli, et al, "Hierarchical demand forecasting benchmark for the distribution grid", EPSR, pp. 1-7, 2020 (Year: 2020).*

Huang et al, "GridTracer: Automatic Mapping of Power Grids using Deep Learning and Overhead Imagery", IEEE, pp. 1-14, Jan. 2021 (Year: 2021).*

Xiao et al, "Topology detection in power distribution system using kernel-node-map deep networks", IET, pp. 1-9, 2020 (Year: 2020).*

Sultan, et al, "A Spatial Analytics Framework to Investigate Electric Power-Failure Events and Their Causes", MDPI, pp. 1-22, 2020 (Year: 2020).*

Cavraro et al, "Graph Algorithms for Topology Identification Using Power Grid Probing", IEEE, pp. 689-694, 2018 (Year: 2018).*

Alagumariappan et al, "Identification of Electrical Faults in Underground Cables Using Machine Learning Algorithm", MDPI, pp. 1-6, 2020 (Year: 2020).*

International Search Report and Written Opinion in International Appln. No. PCT/US2022/028484, Aug. 26, 2022, 13 pages.

Arderne et al., "Predictive mapping of the global power system using open data," Scientific Data, 2020, 7(19):12 pages.

International Preliminary Report on Patentability in International Appln. No. PCT/US2022/028484, Nov. 30, 2023, 8 pages.

* cited by examiner

OBTAINING GEOSPATIAL DATA REPRESENTING A GEOGRAPHIC AREA THAT INCLUDES AN ELECTRICAL DISTRIBUTION SYSTEM 402

GENERATING ELECTRICAL DISTRIBUTION SYSTEM ASSET DATA FROM THE GEOSPATIAL DATA 404

PROCESSING THE ELECTRICAL DISTRIBUTION SYSTEM ASSET DATA USING A CONNECTION MODEL CONFIGURED TO PREDICT ELECTRICAL CONNECTIONS BETWEEN ASSETS OF THE ELECTRICAL DISTRIBUTION SYSTEM 406

OBTAINING, FROM THE CONNECTION MODEL, OUTPUT DATA INDICATING PREDICTED ELECTRICAL CONNECTIONS BETWEEN ASSETS OF THE ELECTRICAL DISTRIBUTION SYSTEM 408

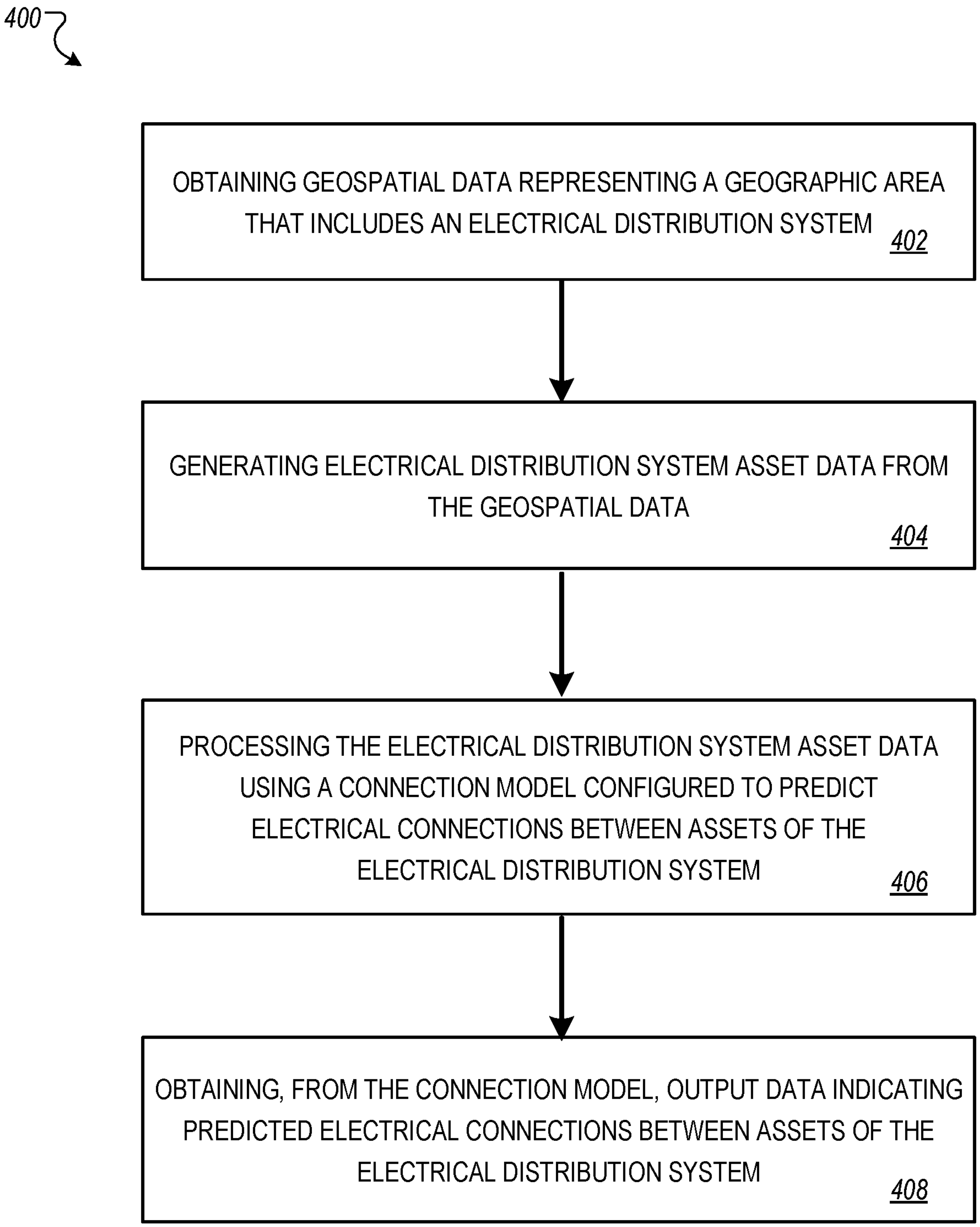

FIG. 4

ELECTRIC GRID CONNECTION MAPPING

CROSS-REFERENCE TO RELATED APPLICATION

This application claims the benefit of U.S. Provisional Patent Application No. 63/190,344, filed May 19, 2021, the contents of which are incorporated by reference herein.

TECHNICAL FIELD

The present specification relates to electrical power grids, and specifically to generating models of electrical power grids.

BACKGROUND

Electrical power grids transmit electrical power to loads such as residential and commercial buildings. Various electrical power grid conditions can be simulated and visualized using electrical power grid models. Electric grid models are used to evaluate and predict operations and potential faults in an electric grid. However, present approaches for modeling electric grids generate inaccurate predictions of the locations of important electric grid assets such as connections between transformers and electrical loads. Paths of underground connections between electrical nodes and loads can be particularly challenging to accurately map.

SUMMARY

In general, the present disclosure relates to a system for accurately modeling electric power grids. Virtual electric grid models are used to evaluate and predict operations and potential faults in an electric grid. Electric grid models can include mappings of electrical connections between power sources, nodes, and loads. For example, electric grid models can include data representing cable connections between loads and transformers, between substations and transformers, from one load to another, and from one transformer to another. In some cases, connections between assets of an electric grid may be visible, e.g., electric grid wires that are connected to above-ground utility poles. In some cases, connections between assets of an electric grid may be hidden, e.g., cables that are located underground or inside enclosures.

The present disclosure provides a system and method to accurately map connections of assets of an electric grid, including hidden connections. The disclosed methods can be used to train a model to map connections between loads and nodes of an electric grid. The trained connection model can receive, as input, data representing loads and nodes identified in geospatial data, and can output connection data for use in electric grid modeling and simulation.

A connection model can be trained using a set of ground truth data that includes mappings of connections between loads and nodes of an electric grid. Loads can include, for example, residential and commercial buildings. Nodes can include, for example, service transformers that are electrically connected to one or more loads. A connection model can receive input data that includes representations of the loads and nodes of the electric grid, and generate corresponding output data. The output data can include a mapping of predicted connections between the nodes and loads. The mapping can include, for example, an assignment of one or more loads to a respective node. The mapping can also include, for example, a predicted connection route, e.g., a predicted underground cable route between a load and a respective node. The output data can be compared to the ground truth data, and parameters of the connection model can be adjusted based on comparing the output data to the ground truth data. The connection model can be, for example, a machine learning model such as an autoencoder model.

A trained connection model can be used for inference to map connections of electric grid assets. For example, the connection model can be integrated into an electric grid model generation system. The electrical grid model generation system can obtain geospatial data representing a geographic area that includes an electric grid that is at least partially hidden, e.g., underground. The geospatial data can include, for example, overhead imagery and street level imagery of the geographic area. In some examples, the geospatial data can include geographic information system (GIS) data, satellite images, topological data, property boundary data, transportation route data, etc. In some implementations, the electrical grid model generation system can receive additional input data, e.g., data related to performance of the electric grid. The additional input data can include, for example, smart meter data, historical electrical power outage data, electrical grid sensor data, etc. Based on the geospatial data and any additional input data, the model generation system can identify assets of the electric grid, e.g., visible nodes and loads of the electric grid.

The electrical grid model generation system can provide data representing the identified assets, e.g., nodes and loads, to the connection model. Data representing an identified asset can include, but is not limited to, a type, size, and/or location of the asset. Data representing an identified asset can also include any identified, e.g., visible, connections between the asset and another asset. Based on the asset data, the trained connection model can generate and output predicted connection paths between the assets. For example, the connection model can generate predicted connection paths between houses and transformers, and between transformers and a substation. In this way, the connection model can predict locations and paths of hidden connections between electric grid assets. The electric grid model generation system can then add representations of the identified nodes and loads, and the predicted connections between them, to a virtual model of the electric grid.

In general, innovative aspects of the subject matter described in this specification can be embodied in an electric grid model gap filling method including actions of: obtaining geospatial data representing a geographic area that includes an electrical distribution system; generating, from the geospatial data, asset data that represents characteristics of electrical distribution system assets, and the asset data including: load data representing electrical loads of the electrical distribution system; and node data representing nodes of the electrical distribution system; processing the asset data using a connection model configured to predict electrical connections between assets of the electrical distribution system; and obtaining, from the connection model; output data indicating predicted electrical connections between assets of the electrical distribution system.

These and other embodiments can include the following features, alone or in any combination. In some implementations, the geospatial data includes at least one of overhead imagery or street level imagery of the geographic area.

In some implementations, the geospatial data includes imagery of the geographic area; and the asset data represents characteristics of electrical distribution system assets that are visible in the imagery of the geographic area.

In some implementations, the output data indicates predicted electrical connections that are not visible in the imagery of the geographic area.

In some implementations, the geospatial data includes overhead imagery of the geographic area.

In some implementations, the actions include identifying electrical distribution system assets in the overhead imagery of the geographic area using image analysis.

In some implementations, the geospatial data includes street level imagery of the geographic area.

In some implementations, the actions include identifying electrical distribution system assets in the street level imagery of the geographic area using image analysis.

In some implementations, the actions include generating, from the geospatial data, above-ground connection data representing above-ground connections between assets of the electrical distribution system and processing the above-ground connection data and the asset data using the connection model. The output data includes data indicating predicted underground connections between the assets of the electrical distribution system.

In some implementations, the load data includes at least one of a location of an electrical load, a type of the electrical load, or a size of the electrical load.

In some implementations, the node data includes at least one of a location of a node, an elevation of the node, a type of the node, or an electrical rating of the node.

In some implementations, the output data includes vector data. In some implementations, the output data includes raster data. In some implementations, the output data includes at least one of vector data or raster data.

In some implementations, connection model includes a convolutional neural network model.

In some implementations, processing the asset data using a connection model includes determining, for each electrical load, a predicted connected node.

In some implementations, processing the asset data using a connection model includes determining, for each electrical load, a connection path between the electrical load and a connected node.

In some implementations, the actions include: providing, to the connection model, auxiliary data; and processing the asset data and the auxiliary data using the connection model.

In some implementations, the auxiliary data includes at least one of geographic information system data, aerial imagery, street level imagery, property boundaries, transportation routes, or topological features within the geographic area.

In some implementations, the auxiliary data includes at least one of electric grid sensor data or historical power outage data within the geographic area.

In some implementations, the connection model is trained to predict electrical connections between assets of the electrical distribution system.

In some implementations, the geospatial data includes overhead imagery of the geographic area. In some implementations, the geospatial data includes street level imagery of the geographic area.

The subject matter described in this specification can be implemented in various embodiments and may result in one or more of the following technical advantages. The disclosed techniques can be used to infer paths of hidden connections of an electric grid based on visible portions of the electric grid. Thus, hidden connections of an electric grid can be mapped using available overhead imagery. Maps of the underground portions of electric grids can be used to improve simulations of electric grid operations. Maps of the underground portions of an electric grid can also be used to improve predictions of fault events, and to improve efficiency of recovering from fault events. For example, a map of underground connections can be used to quickly identify high priority loads for restoration after a loss of power.

Other implementations of the above aspects include corresponding systems, apparatus, and computer programs, configured to perform the actions of the methods, encoded on computer storage devices. The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF DRAWINGS

FIG. 4 is a flow diagram of an example process for predicting connections in an electrical power grid model.

Like reference numbers and designations in the various drawings indicate like elements.

DETAILED DESCRIPTION

In general, the present disclosure relates to a system for accurately modeling electric power grids. Virtual electric grid models are used to evaluate and predict operations and potential faults in an electric grid. Electric grid models can include mappings of electrical connections between power sources, nodes, and loads. For example, electric grid models can include data representing cable connections between loads and transformers, between substations and transformers, from one load to another, and from one transformer to another. In some cases, connections between assets of an electric grid may be visible, e.g., electric grid wires that are connected to above-ground utility poles. In some cases, connections between assets of an electric grid may be hidden, e.g., cables that are located underground or inside enclosures. In some areas of an electric grid, only some of the electric grid lines may be located underground, and other grid lines may be located above ground. In some areas of an electric grid, the electric grid lines for entire regions such as neighborhoods may be completely underground.

Maps of hidden portions, e.g., underground portions, of electric grids can be integrated into virtual electric grid models. The maps of the underground portions of electric grids can be used to identify which loads and other grid assets are connected to the same feeder line. Mapping underground connections that connect grid assets to feeder lines can improve simulations of electric grid operations and predictions of fault events.

Figure 1:
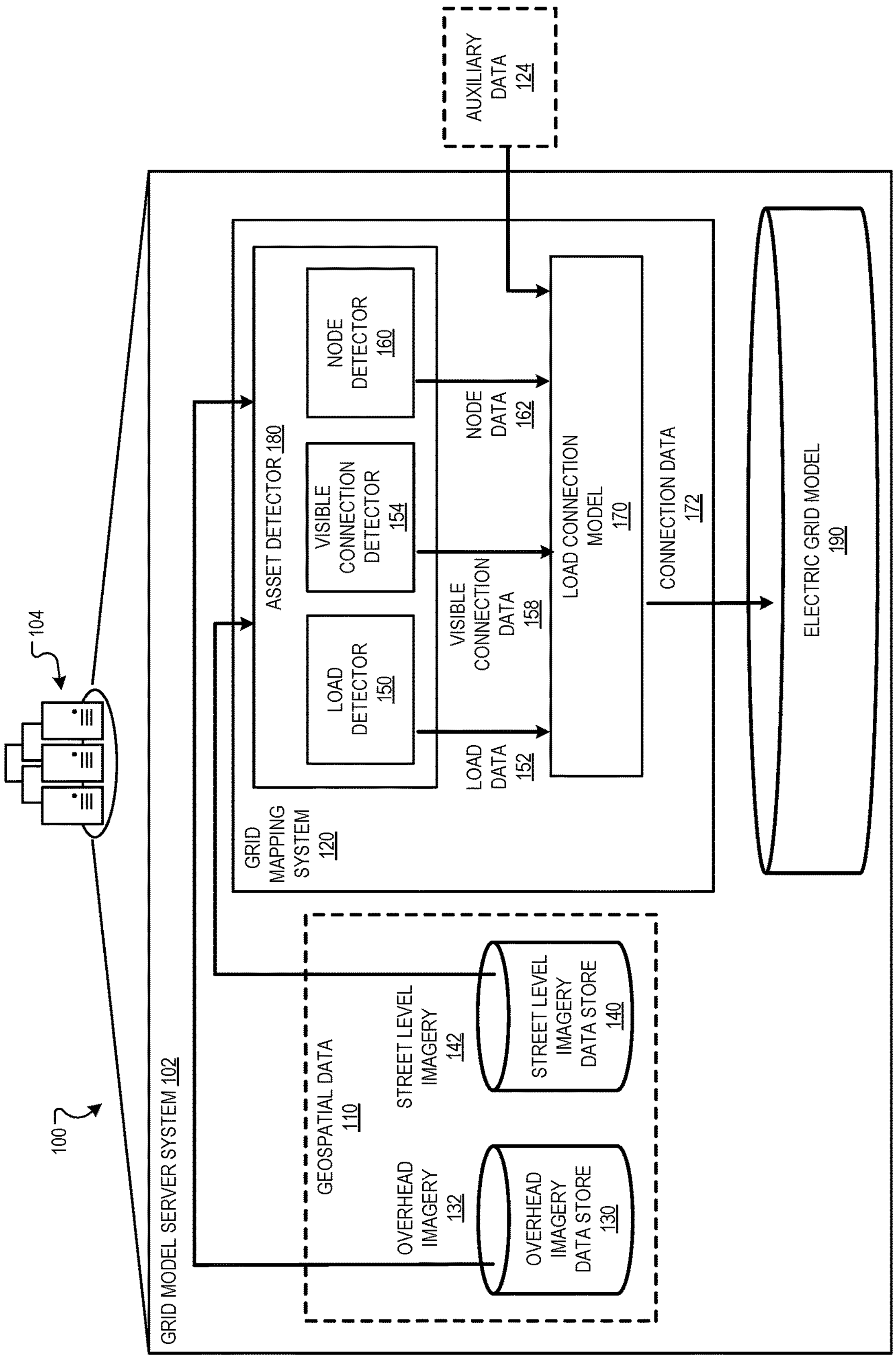
FIG. 1 is a diagram of an example system for electrical power grid modeling.

FIG. 1 is a diagram of an example system 100 for electrical power grid modeling. The system 100 can be used to perform a process 400 for predicting connections in an electrical power grid model. A flow diagram of the process 400 is illustrated in FIG. 4.

The system 100 includes a grid model server system 102. The server system 102 may be hosted within a data center

104, which can be a distributed computing system having hundreds or thousands of computers in one or more locations.

The server system 102 includes an overhead imagery data store 130 and a street level imagery data store 140. The server system 102 also includes a grid mapping system 120 that includes an asset detector 180 and a load connection model 170. The grid mapping system 120, the asset detector 180, and the load connection model 170 can each be provided as one or more computer executable software modules or hardware modules. That is, some or all of the functions of grid mapping system 120, the asset detector 180, and the load connection model 170 can be provided as a block of computer code, which upon execution by a processor, causes the processor to perform functions described below. Some or all of the functions of grid mapping system 120 the asset detector 180, and the load connection model 170 can be implemented in electronic circuitry, e.g., by individual computer systems (e.g., servers), processors, microcontrollers, a field programmable gate array (FPGA), or an application specific integrated circuit (ASIC). The server system 102 also includes an electric grid model 190.

The process 400 includes obtaining geospatial data 110 representing a geographic area that includes an electrical distribution system (402). The geospatial data 110 can include imagery of the geographic area. In some examples, the geospatial data includes overhead imagery 132 from the overhead imagery data store 130 and street level imagery 142 from the street level imagery data store 140. In some examples, the geospatial data 110 can include GIS data, topological data, property boundary data, transportation route data, etc. In some implementations, the electrical grid model generation system can receive additional input data, e.g., data related to performance of the electric grid.

The overhead imagery 132 stored in the overhead imagery data store 130 can be generated by overhead sensors. Overhead sensors can include, for example, aerial and satellite sensors. Overhead sensors can include visible light cameras, infrared sensors, RADAR sensors, and LIDAR sensors.

The overhead imagery 132 can include visible light data, e.g., red-green-blue (RGB) data, collected by the overhead sensors. The overhead imagery 132 can also include hyperspectral data, multispectral data, infrared data, RADAR data, and LIDAR data collected by the overhead sensors.

The overhead imagery 132 can include two-dimensional (2D) data, 2.5D data, or 3D data. The overhead imagery 132 can include multiple channels or layers of imagery data. For example, the overhead imagery 132 can include an RGB layer, a height model layer, a digital surface model layer, and a vegetation index layer.

The overhead imagery 132 can include data from multiple images collected over time. In some examples, the overhead sensors capture multiple images and generate a combined image from the multiple images.

In some implementations, the overhead imagery 132 can include images of a geographic area in raster format. The overhead imagery 132 can include multiple raster image segments that each represents a portion of the geographic area. The portion of the geographic area can be, for example, a square mile, five square miles, ten acres, etc.

The overhead imagery 132 represents features of a geographic area. The geographic area can include, for example, an area of hundreds of square meters, several kilometers, hundreds of kilometers, or thousands of kilometers. The geographic area can correspond to a location of an electrical distribution feeder or multiple feeders. In some cases, the geographic area can correspond to a location of a bulk power system within and throughout, e.g., a state, county, province, or country. The server system 102 can store the overhead imagery 132 in the overhead imagery data store 130.

The street level imagery 142 stored in the street level imagery data store 140 can be generated by street level sensors. Street level sensors can include, for example, sensors that receive reflections of electromagnetic radiation, e.g., LIDAR systems that detect reflections of laser light, radar systems that detect reflections of radio waves, and camera systems that detect reflections of visible light.

The process 400 includes generating electrical distribution system asset data from the geospatial data 110 (404). For example, the asset detector 180 can analyze the overhead imagery 132 and the street level imagery 142 to identify locations of electric grid assets. The asset detector 180 includes load detector 150, node detector 160, and visible connection detector 154. The asset detector 180 generates asset data including load data 152, node data 162, and visible connection data 158. The asset detector 180 can generate the asset data based on analyzing any combination of the overhead imagery 132 and the street level imagery 142.

Based on the geospatial data 110, the asset detector 180 can identify assets of the electric grid, e.g., visible nodes and loads of the electric grid. The asset detector 180 can detect electric grid assets by performing image analysis on the overhead imagery 132 and street level imagery 142. For example, the asset detector 180 can apply algorithms for object detection, object identification, and/or object recognition to the street level imagery 142. By applying object detection algorithms to the selected overhead imagery 132 and street level imagery 142, the asset detector 180 can identify or detect the existence of various above-ground electric grid assets. In some examples, the asset detector 180 can combine multiple images of the geographic area in order to generate a combined image. The combined image can include multiple stacked or overlaid images. The combined image may have reduced noise compared to individual images. Analyzing a combined image can improve grid asset identification compared to analyzing a single image. Grid assets can include, for example, transformers, capacitors, crossarms, risers, insulators, reclosers, switch handles, switch control rods, voltage regulators, feeders, etc., Loads can include, for example, residential and commercial buildings. The load detector 150 can identify loads and generate load data 152 from the geospatial data 110. Load data 152 can include, for each identified load, a location of the load, a type of the load, a size of the load, etc. In some examples, the load detector 150 can identify loads based on identifying locations of meters. For example, a residential property may have an electric meter installed external to the property. The load detector 150 can analyze street level imagery to identify locations of meters, and therefore to identify locations of loads.

Nodes can include, for example, service transformers, distribution transformers, meters, risers, switches, etc. Each node can be connected to one or more loads. In some examples, a node can be mounted on an above-ground utility pole. In some examples, a node can be mounted on a concrete pad and enclosed in a casing. In some examples, a node can be located in an underground vault. The vault may have a vault cover that is visible and identifiable from overhead. The node detector 160 can identify nodes and generate node data 162 from the geospatial data 110. Node data 162 can include, for each identified node, a geographic location of the node, a type of the node, one or more electrical ratings of the node, etc. Node data 162 can also include an identification of a utility pole to which the node is mounted, an elevation of the node, a classification of the node, an on/off status of the node, etc.

Visible connections can include, for example, above-ground grid wires that are visible to overhead sensors. Visible connections can include above-ground connections between power sources and nodes of the electric grid, and above-ground connections between two or more nodes of the electric grid. Visible connections can also include above-ground service lines connecting loads to nodes. The visible connection detector 154 can identify visible connections and generate visible connection data 158 from the geospatial data 110. A visible connection can be, for example, a connection that is visible in overhead imagery, in street level imagery, or both. In some examples, visible connection data 158 includes above-ground connection data representing connections that are above ground.

Visible connection data 158 can include, for each identified connection, a geographic location of the connection, a path of the connection, an elevation of the connection, a length of the connection, an orientation of the connection, and grid assets that are connected to the connection. In some examples, the visible connection data 158 can include coordinate locations, e.g., a latitude and longitude, of starting points and end points for each connection. In some examples, the visible connection detector might not detect any visible connections. For example, the geographic area may include electrical connections that are entirely hidden, e.g., underground.

The process 400 includes processing the electrical distribution system asset data using a connection model that is configured to predict electrical connections between assets of the electrical distribution system (406). For example, the load data 152, the node data 162, and the visible connection data 158 can be processed by the load connection model 170. The load connection model 170 can then perform an inference operation to predict connections in the electric grid.

The electrical grid model generation system can provide data representing the identified assets, e.g., nodes and loads, to the connection model. For example, the trained load connection model 170 can receive, as input, load data 152 and node data 162. Data representing an identified asset can include, but is not limited to, a type, size, and/or location of the asset. Data representing an identified asset can also include visible connection data 158 representing any identified, e.g., visible, connections between two or more assets.

In some implementations, the load connection model 170 can receive, as input, auxiliary data 124. The auxiliary data 124 can include, for example, data related to performance of the electric grid. In some examples, the auxiliary data 124 can include smart meter data, historical electrical power outage data, and electrical grid sensor data.

Figure 3A:
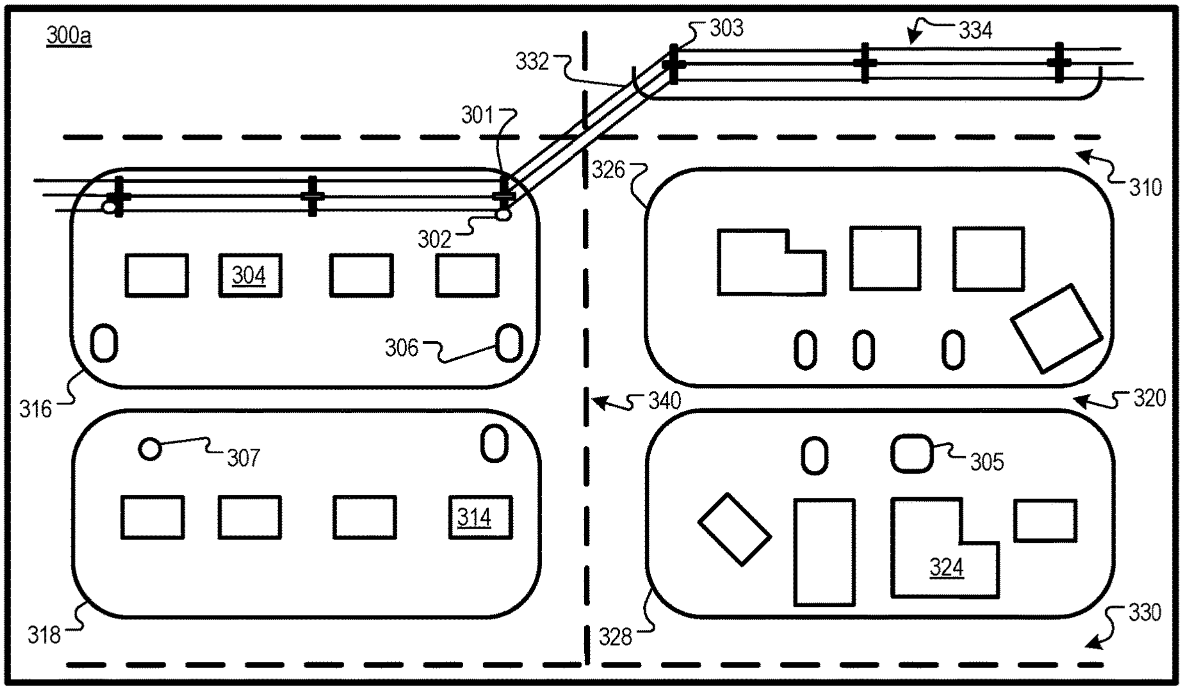
FIG. 3A illustrates an example geographic area including nodes, loads, and visible electrical connections.

FIG. 3A is an illustration of an overhead view 300*a* of nodes, loads, and visible connections for an example geographic area. The overhead view 300 depicts a neighborhood of four blocks 316, 318, 326, and 328. The blocks 316, 318, 326, and 328 are located between streets 310 and 330. Alley 320 separates blocks 316, 326 from blocks 318, 328. Street 340 separates blocks 316, 318 from blocks 326, 328.

The overhead view 300*a* includes nodes 302, 305, 306, and 307. Node 302 is a pole-mounted riser connected to utility pole 301. A riser is a device, or set of devices, that connects an overhead electric grid line to an underground line. A riser can include a conduit that extends from the ground up the utility pole to a connection with the overhead electric grid line. Nodes 305, 306, and 307 are ground mounted transformers with no visible connections to other grid assets. The overhead view 300*a* includes loads 304, 314, and 324. Loads 304 and 314 are residential buildings. Load 324 is a commercial building.

The overhead view 300*a* includes above-ground grid wires 334. The grid wires 334 include visible connection 332 connected to utility poles 301 and 303. The grid wires 334 connect to a substation that is not shown in the overhead view 330*a*. In the overhead view 300*a*, all of the loads appear to be islanded, e.g., none of the loads are visibly connected to the grid wires 334.

The load connection model 170 can receive input data including load data 152 representing the loads of the geographic area, e.g., loads 304, 314, 324. The input data can also include node data 162 representing the nodes of the geographic area, e.g., 302, 305, 306, 307. The input data can also include visible connection data 158 representing the visible connections of the geographic area, e.g., visible connection 332. The input data can also include auxiliary data 124. Based on the input data, the load connection model 170 can generate predicted connections that are not visible in the overhead view 300*a*.

In some implementations, the load connection model 170 can apply one or more rules in order to predict connections. An example rule can be that all electric grid assets must be connected to a substation of the electric grid, either directly or transitively. The load connection model 170 can identify electric grid assets that appear to be islanded from the electric grid, e.g., assets that have no visible connection to a substation. For example, in the overhead view 300*a*, the loads 304, 314, and 324 appear to be islanded from the electric grid wires 334, and therefore have no visible connections to a substation. Since all electric grid assets must connect to a substation, the load connection model 170 can predict underground connections between each of the islanded assets and the grid wires 334.

To predict underground connections between the loads and the electric grid wires 334, the load connection model 170 can analyze the node data 162. The node data 162 can include, for example, data indicating locations of risers. Based on node data for a riser located at or near an islanded portion of the electric grid, the load connection model 170 can predict the most likely connection between the riser and islanded transformers.

Other example rules can be related to predicted distances between transformers and loads. For example, transformers are typically located outside of commercial and industrial buildings, with each commercial or industrial building having a designated connected transformer. Thus, each commercial transformer may be a node that connects to a single load. A rule may be that the closest transformer to a commercial or industrial load is likely the transformer connected to that load. In residential areas, transformers may connect to more than one residential building. Rules can designate a maximum distance between transformers and residential loads, and a maximum number of residential loads per transformer. Rules can also specify load balancing requirements between phases of the electric grid.

Other example rules can be related to clustering loads. For example, the load connection model 170 can predict connections based on features of the geographic area such as neighborhood blocks, streets, sidewalks, alleys, etc. In some examples, the load connection model 170 can cluster loads based on distance heuristics, treating each load as a leaf node of the cluster. The load connection model 170 can then predict connections to a node in a radial structure. An example rule may be that residential buildings on the same side of a street are likely connected to the same transformer. Another example rule may be that properties that back up to the same alley are likely connected to the same transformer, subject to maximum distance requirements.

In some implementations, the load connection model 170 can receive, as input, auxiliary data 124. The auxiliary data 124 can be used to inform interconnection topology and interconnection parasitics for underground connections. In some examples, the auxiliary data 124 can include smart meter data generated from smart meters installed at loads of the electric grid. The smart meter data can include, for example, a phase of the metered load. In some examples, high resolution voltage measurement measured at a location of a smart meter can indicate the position of the meter in relation to the feeder or sub-feeder. Smart meter data can include data collected from meters connected to inverter connected resources, e.g., photovoltaic inverters and electric vehicle charging stations. These smart meters may have enhanced smart metering and reporting capability. Smart meters can provide data indicating electrical parameters such as voltage, voltage rise and drop, and power flows at the location of the connected inverter.

The auxiliary data 124 can also include, for example, historical electrical power outage data. The historical electrical power outage data can identify groups of loads that lost power and/or restored power at the same time. By analyzing loads that lost power at the same time, the load connection model 170 can improve the prediction of which loads are connected to the same feeder.

The auxiliary data 124 can also include electrical grid sensor data. The electric grid sensor data can include data collected from sensors installed at various points on the electric grid. The electric grid sensor data can include, for example, electric field and magnetic field data.

In some examples, the auxiliary data 124 can include overhead imagery, e.g., satellite imagery. The load connection model 170 can analyze the overhead imagery to identify features such as access points to electric grid connections. For example, an image of a manhole cover can indicate the location of an underground transformer or electrical connection. In another example, an image of a street level vault can indicate the presence of a street level transformer of electrical connection. In some examples, features such as manhole covers and street level vaults can be identified by analyzing auxiliary data that includes GIS data.

In some examples, the auxiliary data 124 can include property boundary data and transportation route data. Property boundary date can identify boundaries between individually owned properties and also in between municipalities, counties, etc. The transportation route data can identify paths of streets, alleys, railways, sidewalks, etc. The property boundary data and transportation route data can include data in vector format, raster format, or both. Electrical connections often run along property boundaries and along streets and pathways. Thus, the trained load connection model 170 can analyze this auxiliary data 124 to improve accuracy of predicting the electric grid connections.

The process 400 includes obtaining, as output from the connection model, data indicating predicted electrical connections between assets of the electrical distribution system (408). The load connection model 170 can include, for example, a machine learning model such as a convolutional neural network model, e.g., an autoencoder model. The load connection model 170 can process the input data and produce, as output, predicted connections between nodes and loads of the electric grid. For example, the load connection model 170 can process the load data 152, node data 162, visible connection data 158, and auxiliary data 124.

The load connection model 170 can output connection data 172 indicating predicted connections between the identified assets of the electric grid. In some examples, the connection data 172 includes a predicted assignment of each load to a node. The connection data 172 can include data in raster format, vector format, or both.

Figure 3B:
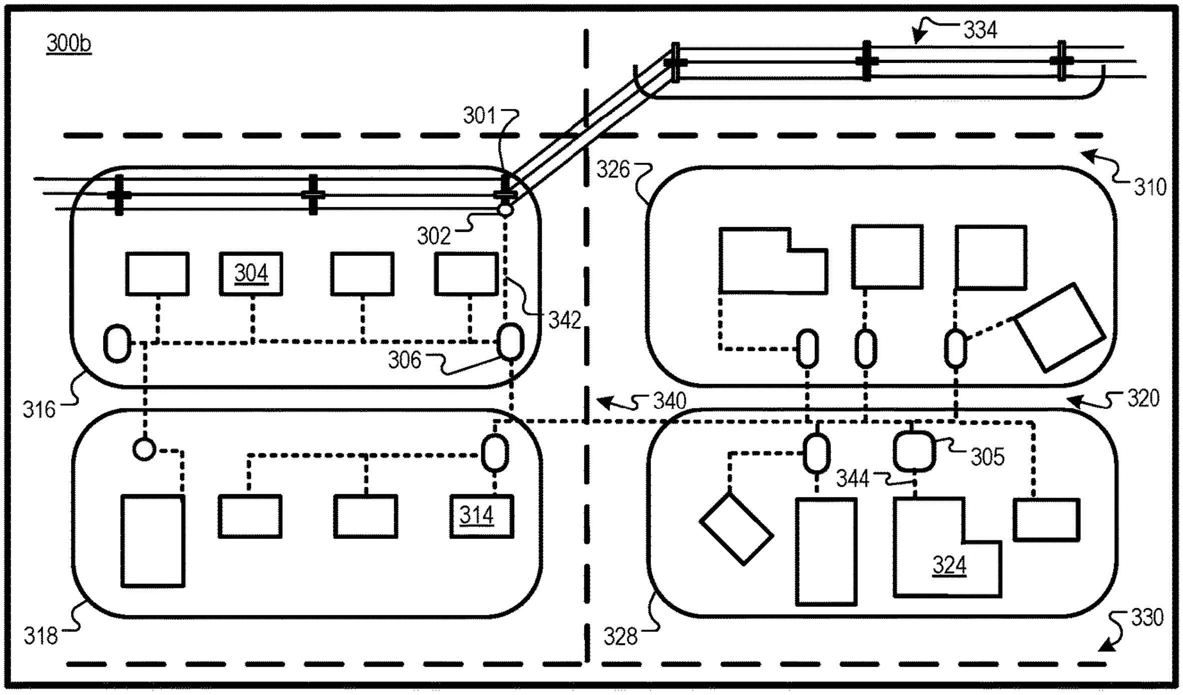
FIG. 3B illustrates inferred hidden electrical connections in the example geographic area of FIG. 3A.

FIG. 3B is an illustration of an overhead view 300*b* showing inferred hidden electrical connections in the example geographic area of FIG. 3A. The inferred hidden electrical connections are illustrated in FIG. 3B as dashed lines, and represent underground connection paths that are predicted by the load connection model 170 to connect the loads to nodes of the electric grid, and therefore to a power substation.

The overhead view 300*b* includes a predicted connection 342 between riser node 302 and transformer node and 306. Within the four blocks 316, 318, 326, 328, transformer node 306 is the closest transformer to the riser node 302. Therefore, the load connection model 170 predicts that the transformer node 306 is connected underground to the riser node 302 by connection 342.

The overhead view 300*b* also includes a predicted connection 344 between load 324 and node 305. Load 324 is classified as a commercial property. Based on the size of the load 324 and the classification of the load 324 as a commercial property, the load connection model 170 predicts that the load 324 is the only load connected to the node 305.

The inferred hidden connections of overhead view 300*b* connect each load to a node. Each node is connected, either directly or transitively, to the riser node 302. The riser node 302 connects to the grid wires 334, which connect to a substation. Thus, none of the nodes in the overhead view 300*b* are islanded from the electric grid, as the inferred hidden connections output by the load connection model 170 predict connections between each load and the substation.

The grid mapping system 120 can output the connection data 172, e.g., data representing predicted connections 342 and 344 and the other predicted connections in overhead view 300*b*, to the electric grid model. The connection data 172 can then be added to the electric grid model 190. In some examples, the connections represented by connection data 172 can each be labeled as underground connections in the electric grid model 190.

The model of the electric grid can include a high resolution model of one or more electrical distribution feeders. The electric grid model 190 can include, for example, data models of substation transformers, medium voltage distribution lines, distribution switches and reclosers, capacitors, voltage regulation schemes, e.g., tapped magnetics or switched capacitors, network transformers, load transformers, inverters, generators, and various loads. The electric grid model 190 can also include transformer locations and capacities, feeder locations and capacities, and load locations.

The grid mapping system 120 can provide the connection data 172 to the electric grid model 190. The electric grid model 190 can then add a representation of the grid wires to the electric grid model 190. Thus the trained load connection model 170 can process data representing an incomplete map of a portion of an electric grid, and output a more complete map of the electric grid for use in modeling and simulation. Adding the connection data 172 to the electric grid model 190 can improve accuracy of the electric grid model 190. For example, adding the connection data 172 to the electric grid model 190 can improve accuracy of monitoring and/or simulating electrical power grid operations using the electric grid model 190.

Figure 2:
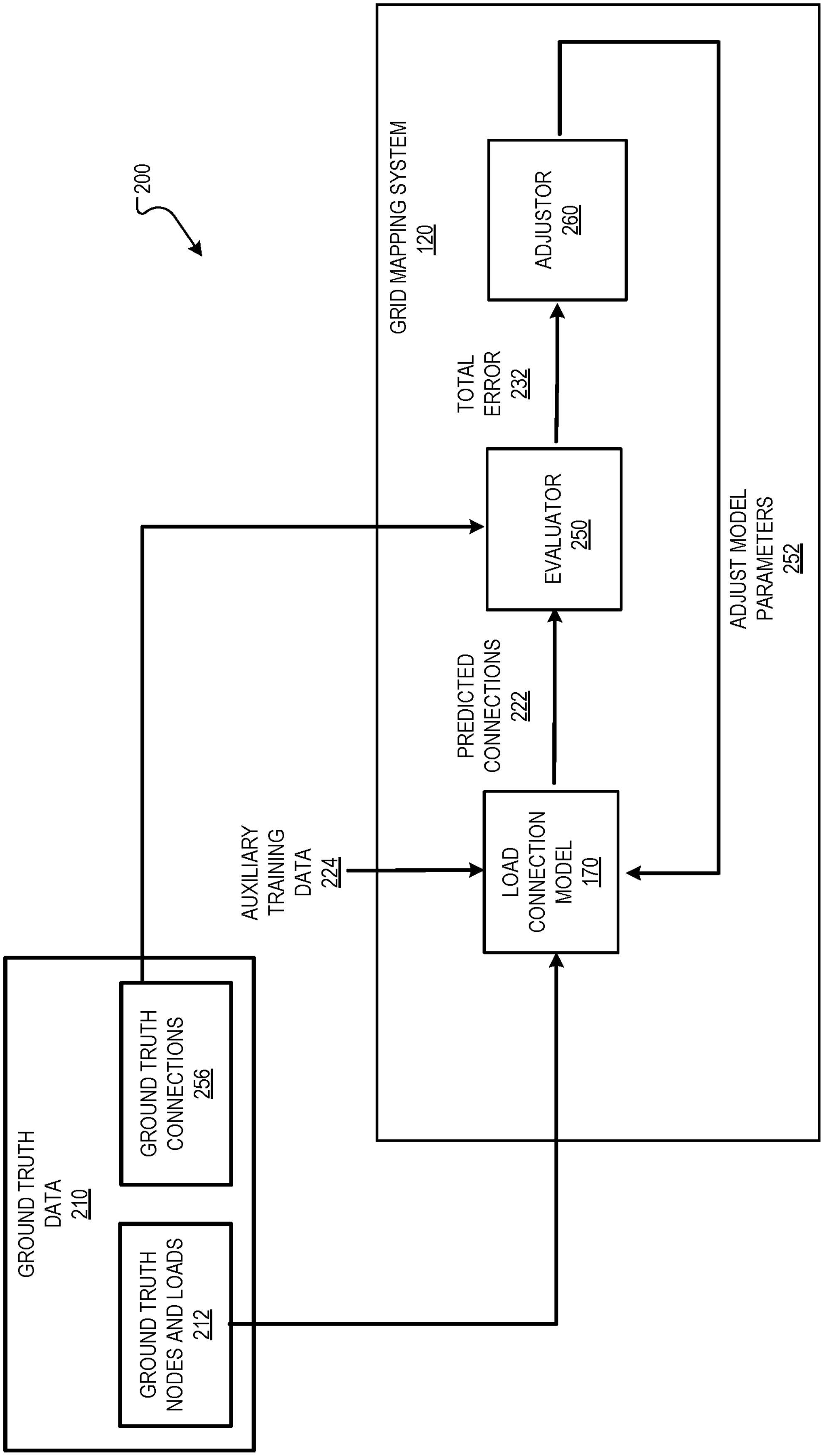
FIG. 2 is a diagram of an example system for training a connection model of a power grid modeling system.

FIG. 2 is a diagram of an example system 200 for training the load connection model 170 of the power grid modeling system 100. The load connection model 170 can be trained using a set of ground truth data that includes mappings of connections between loads and nodes of an electric grid. The load connection model 170 can receive input data that includes representations of the loads and nodes of the electric grid, and generate corresponding output data. The output data can include a mapping of predicted connections between the nodes and loads. The mapping can include, for example, an assignment of one or more loads to a respective node. The mapping can also include, for example, a predicted connection route, e.g., a predicted underground cable route between a load and a respective node. The output data can be compared to the ground truth data, and parameters of the connection model can be adjusted based on comparing the output data to the ground truth data.

The load connection model 170 can be trained using a supervised training process. The load connection model 170 can be trained using sets of ground truth data 210 that indicate ground truth connections 256 between ground truth nodes and loads 212 of an electric grid. The ground truth data 210 can be labeled by a human. For example, a human may identify connections between loads and nodes, and may label each connection as an above-ground or underground connection.

The ground truth nodes and loads 212 can be provided as input to the load connection model 170. In some examples, auxiliary training data 224 can provide additional context that can be used to train the load connection model 170. The auxiliary training data 224 can include, e.g., topological features, property boundaries, transportation routes, historical power outage information, etc. of a geographic area.

The load connection model 170 can output predicted connections 222. The predicted connections 222 can include an assignment of each load to a node. In some examples, the predicted connections 222 can include a predicted path of each connection. In some examples, the predicted connections 222 can include raster data, vector data, or both, representing the location and path of each connection.

The evaluator 250 can compare the predicted connections 222 to the ground truth connections 256. The evaluator 250 can determine a total error 232 between the predicted connections 222 and the ground truth connections 256. The evaluator 430 can determine a total error 232 between the predicted connections 222 and the ground truth connections 256.

The total error 432 between the predicted connections 222 and the ground truth connections 256 can include different types of errors. For example, a first type of error can occur when a predicted connection 222 connects a load to an incorrect node. A second type of error can occur when the predicted connection 222 connects a load to a correct node, but the predicted path is incorrect. A third type of error can occur when the predicted connection 222 connects a load to a correct node, but the predicted connection between the node and the substation is incorrect. In another example, an error may occur when the predicted connections 222 fail to connect all nodes and loads to a substation.

Parameters of the load connection model 170 can be adjusted based on comparing the predicted connections 222 to the ground truth connections 256. For example, the adjustor 260 can adjust model parameters 252 based on the total error 232. Model parameters can include, for example, configuration variables, neural network weights, support vectors, and coefficients of the model. Model parameters can also include, for example, threshold and ranges that are applied to various rules within the load connection model 170. By adjusting the model parameters based on the total error 232, the load connection model 170 can be trained to accurately predict connections between assets of the electric grid.

Parameters of the load connection model can be adjusted based on comparing the output images to the ground truth images. For example, the adjustor 260 can adjust model parameters 252 based on the total error 232. Thus, the load connection model 170 can be trained to accurately predict connections of partial maps of the electric grid.

Implementations of the subject matter and the functional operations described in this specification can be implemented in digital electronic circuitry, in tangibly-implemented computer software or firmware, in computer hardware, including the structures disclosed in this specification and their structural equivalents, or in combinations of one or more of them. Implementations of the subject matter described in this specification can be implemented as one or more computer programs, i.e., one or more modules of computer program instructions encoded on a tangible non-transitory program carrier for execution by, or to control the operation of, data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including, by way of example, a programmable processor, a computer, or multiple processors or computers. The apparatus can also be or further include special purpose logic circuitry, e.g., a central processing unit (CPU), a FPGA (field programmable gate array), or an ASIC (application-specific integrated circuit). In some implementations, the data processing apparatus and/or special purpose logic circuitry may be hardware-based and/or software-based. The apparatus can optionally include code that creates an execution environment for computer programs, e.g., code that constitutes processor firmware, a protocol stack, a database management system, an operating system, or a combination of one or more of them. The present disclosure contemplates the use of data processing apparatuses with or without conventional operating systems, for example Linux, UNIX, Windows, Mac OS, Android, iOS or any other suitable conventional operating system.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third party services, components, libraries, and such, as appropriate. Conversely, the features and functionality of various components can be combined into single components as appropriate.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., a central processing unit (CPU), a FPGA (field programmable gate array), or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media (transitory or non-transitory, as appropriate) suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The memory may store various objects or data, including caches, classes, frameworks, applications, backup data, jobs, web pages, web page templates, database tables, repositories storing business and/or dynamic information, and any other appropriate information including any parameters, variables, algorithms, instructions, rules, constraints, or references thereto. Additionally, the memory may include any other appropriate data, such as logs, policies, security or access data, reporting files, as well as others. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube), LCD (liquid crystal display), or plasma monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The term "graphical user interface," or GUI, may be used in the singular or the plural to describe one or more graphical user interfaces and each of the displays of a particular graphical user interface. Therefore, a GUI may represent any graphical user interface, including but not limited to, a web browser, a touch screen, or a command line interface (CLI) that processes information and efficiently presents the information results to the user. In general, a GUI may include a plurality of user interface (UI) elements, some or all associated with a web browser, such as interactive fields, pull-down lists, and buttons operable by the business suite user. These and other UI elements may be related to or represent the functions of the web browser.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN), a wide area network (WAN), e.g., the Internet, and a wireless local area network (WLAN).

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of sub-combinations.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be helpful. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations, alterations, and permutations of the described implementations are within the scope of the following claims as will be apparent to those skilled in the art. For example, the actions recited in the claims can be performed in a different order and still achieve desirable results.

Accordingly, the above description of example implementations does not define or constrain this disclosure. Other changes, substitutions, and alterations are also possible without departing from the spirit and scope of this disclosure.

What is claimed is:

1. A method comprising:

obtaining imagery of a geographic area that includes an electrical distribution system;

generating, from the imagery, asset data that represents characteristics of a plurality of electrical distribution system assets that are represented in the imagery, the asset data including:

load data that represents electrical loads of the electrical distribution system; and node data that represents nodes of the electrical distribution system;

processing the asset data using a connection model configured to predict electrical connection paths between electrical distribution system assets; and obtaining, from the connection model, output data indicating predicted electrical connection paths between the plurality of electrical distribution system assets, wherein the predicted electrical connection paths are not represented in the imagery.

2. The method of claim 1, comprising:

generating, from the imagery, above-ground connection data representing above-ground connection paths between assets of the electrical distribution system; and processing the above-ground connection data and the asset data using the connection model, wherein the output data comprises data indicating predicted underground connection paths between the assets of the electrical distribution system.

3. The method of claim 1, wherein the imagery includes overhead imagery of the geographic area.

4. The method of claim 3, comprising identifying electrical distribution system assets in the overhead imagery of the geographic area using image analysis.

5. The method of claim 1, wherein the imagery includes street level imagery of the geographic area.

6. The method of claim 5, comprising identifying electrical distribution system assets in the street level imagery of the geographic area using image analysis.

7. The method of claim 1, wherein the load data includes at least one of a location of an electrical load, a type of the electrical load, or a size of the electrical load.

8. The method of claim 1, wherein the node data includes at least one of a location of a node, an elevation of the node, a type of the node, or an electrical rating of the node.

9. The method of claim 1, wherein the output data includes at least one of vector data or raster data.

10. The method of claim 1, wherein the connection model comprises a convolutional neural network model.

11. The method of claim 1, wherein processing the asset data using a connection model comprises determining, for each electrical load, a predicted connected node.

12. The method of claim 1, wherein processing the asset data using a connection model comprises determining, for each electrical load, a connection path between the electrical load and a connected node.

13. The method of claim 1, comprising:

providing, to the connection model, auxiliary data; and processing the asset data and the auxiliary data using the connection model.

14. The method of claim 13, wherein the auxiliary data includes at least one of geographic information system data, aerial imagery, street level imagery, property boundaries, transportation routes, or topological features within the geographic area.

15. The method of claim 13, wherein the auxiliary data includes at least one of electric grid sensor data or historical power outage data within the geographic area.

16. The method of claim 1, wherein the connection model is trained to predict electrical connection paths between assets of the electrical distribution system.

17. A system comprising one or more computers and one or more non-transitory computer storage media storing instructions that are operable, when executed by the one or more computers, to cause the one or more computers to perform operations comprising:

obtaining imagery of a geographic area that includes an electrical distribution system;

generating, from the imagery, asset data that represents characteristics of a plurality of electrical distribution system assets that are represented in the imagery, the asset data including:

load data that represents electrical loads of the electrical distribution system; and node data that represents nodes of the electrical distribution system;

processing the asset data using a connection model configured to predict electrical connection paths between electrical distribution system assets; and obtaining, from the connection model, output data indicating predicted electrical connection paths between the plurality of electrical distribution system assets, wherein the predicted electrical connection paths are not represented in the imagery.

18. A non-transitory computer storage medium encoded with instructions that, when executed by one or more computers, cause the one or more computers to perform operations comprising:

obtaining imagery of a geographic area that includes an electrical distribution system;

generating, from the imagery, asset data that represents characteristics of a plurality of electrical distribution system assets that are represented in the imagery, the asset data including:

load data that represents electrical loads of the electrical distribution system; and node data that represents nodes of the electrical distribution system;

processing the asset data using a connection model configured to predict electrical connection paths between electrical distribution system assets; and obtaining, from the connection model, output data indicating predicted electrical connection paths between the plurality of electrical distribution system assets, wherein the predicted electrical connection paths are not represented in the imagery.

* * * * *